(12) United States Patent  
Lai

(10) Patent No.: US 6,999,310 B1
(45) Date of Patent: Feb. 14, 2006

(54) ROTATABLE DEVICE FOR HARD DISK DRIVE

(75) Inventor: Vincent Lai, Taoyuan Hsien (TW)

(73) Assignee: In Win Development, Inc., Taoyuan Hsien (TW)

( * ) Notice: Subject to any disclaimer, the term of this patent is extended or adjusted under 35 U.S.C. 154(b) by 0 days.

(21) Appl. No.: 10/900,671

(22) Filed: Jul. 27, 2004

(51) Int. Cl.
*G06F 1/20* (2006.01)

(52) U.S. Cl. .................... 361/685; 361/695; 312/223.2

(58) Field of Classification Search ........ 361/679–687, 361/724–727, 692, 695, 749, 759, 801; 312/223.1–223.6; 403/52
See application file for complete search history.

(56) References Cited

U.S. PATENT DOCUMENTS

| | | | | |
|---|---|---|---|---|
| 6,473,297 B1 * | 10/2002 | Behl et al. | .................... | 361/685 |
| 6,565,163 B2 * | 5/2003 | Behl et al. | ................ | 312/223.1 |
| 6,628,518 B2 * | 9/2003 | Behl et al. | .................... | 361/687 |
| 6,853,551 B2 * | 2/2005 | Baar et al. | .................... | 361/687 |
| 2004/0156671 A1 * | 8/2004 | Tucker | ........................ | 403/52 |
| 2005/0152106 A1 * | 7/2005 | Coster et al. | ................ | 361/683 |

* cited by examiner

*Primary Examiner*—Hung Van Duong
(74) *Attorney, Agent, or Firm*—Pro-Techtor Int'l Services

(57) ABSTRACT

The present invention includes a rotatable device, which is installed underneath a floppy disc rack unit and a hard drive rack unit. The hard drive rack unit is capable of turning by 90 degrees by lifting a handle block of the rotatable device, thus enabling easy installation or replacement of the hard drive rack in a computer casing.

1 Claim, 3 Drawing Sheets

ROTATABLE DEVICE FOR HARD DISK DRIVE

BACKGROUND OF THE INVENTION (a) Field of the Invention

The present invention relates to a rotatable to device for easy installation and replacement of a hard drive rack unit, more particularly to a rotatable device which is mounted inside a computer casing, installed underneath a floppy disc rack unit and on top of the hard drive rack unit.

(b) Description of the Prior Art

The conventional rack unit for containing hard drive rack unit is made mostly a fixed and non-turnable or movable structure. When installing a hard drive rack unit, the rack unit has to be fixed to an inner side of a computer casing. The space inside of the computer casing is very much limited since there are different devices or equipment being installed, which is used to the view for assemblyman, thus making the installation work more complicated and toilsome.

SUMMARY OF THE INVENTION

The primaryine object of the present invention is to provide a rotable device inside a computer casing, which is installed underneath a floppy disc unit and on top of hard drive rack unit. The rotatable device is caapable of truning the hard drive rack unit by 90 degrees and detatchable from the other unity being installed inside a computer casing, thus making the installing or replacing of a hard drive rack unit simple and easy.

DESCRIPTION OF THE PREFERRED EMBODIMENTS

Figure 1:
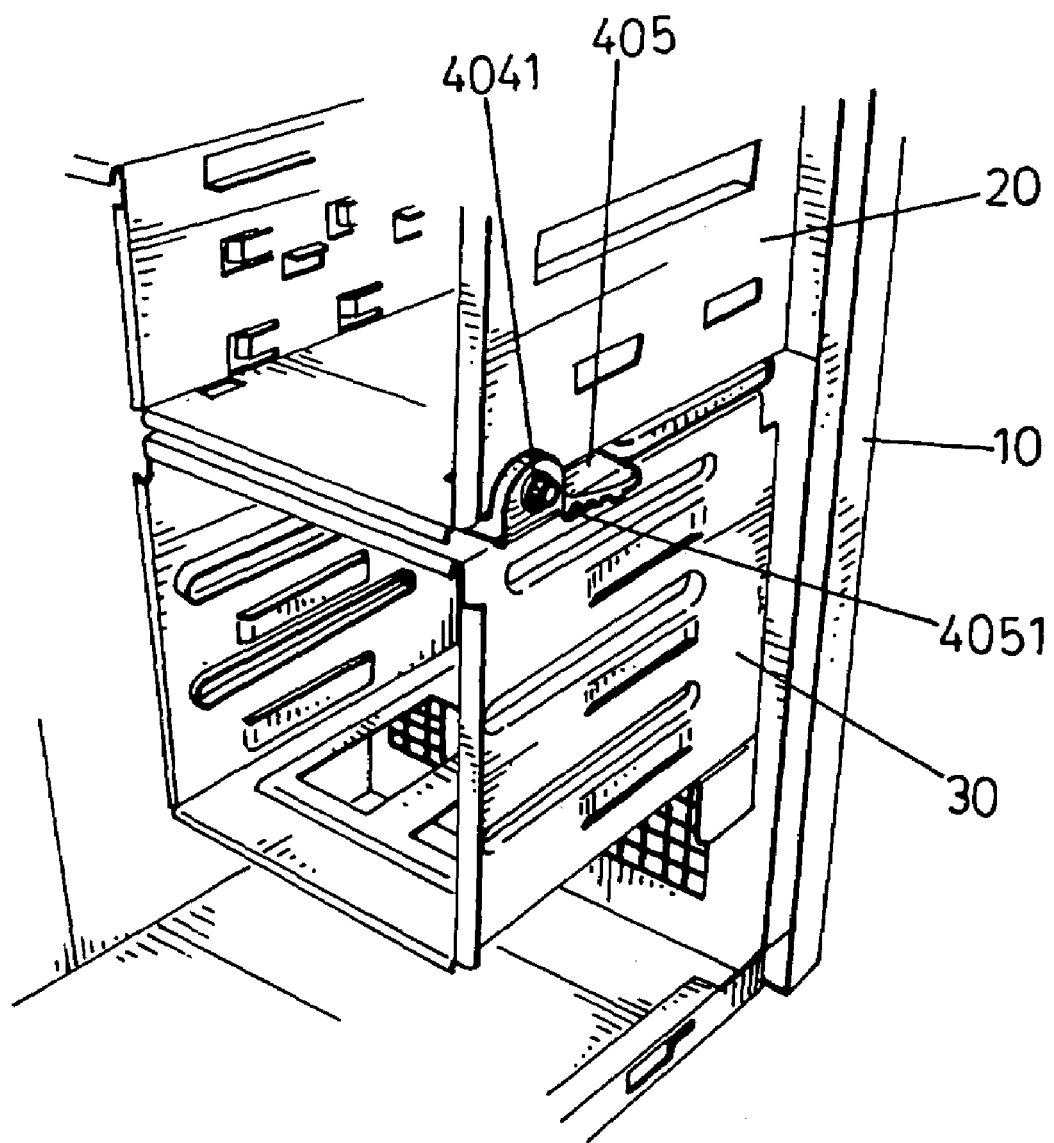
FIG. 1 shows a perspective structural view of the present invention.
Figure 2:
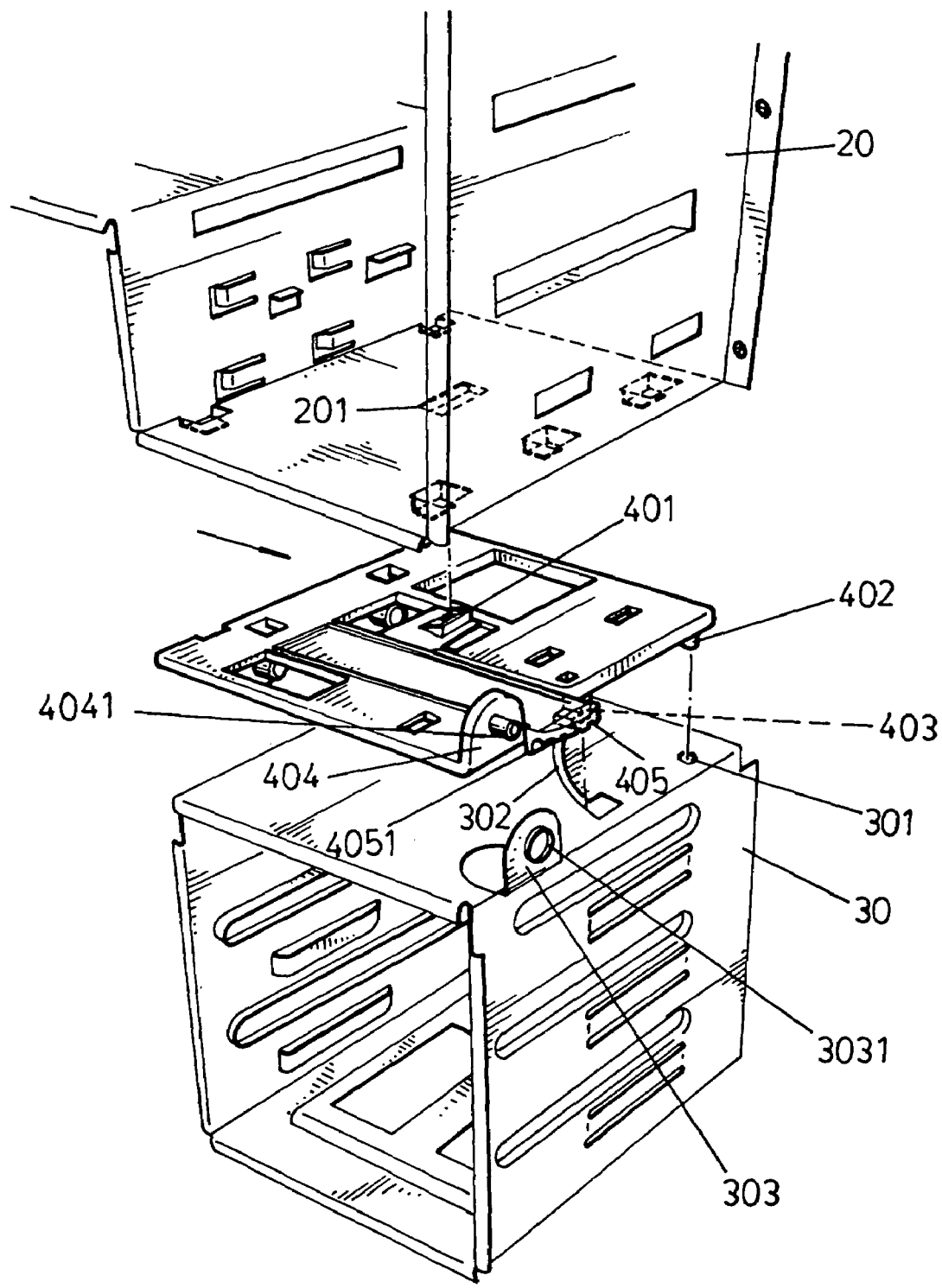
FIG. 2 shows a perspective exploded view of the present invention.
Figure 3:
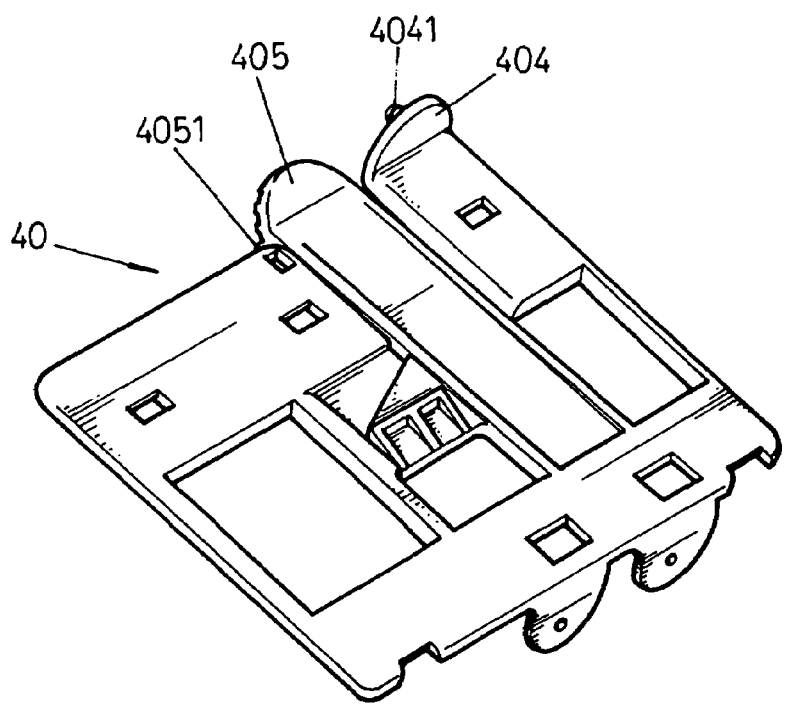
FIG. 3 shows a perspective isometric view of the rotatable device according to the present invention.

Referring to FIG. 1 and FIG. 2, a hard disk drive rack unit 30 is installed underneath a floppy disc drives rack unit 20 inside a computer casing 10. A plurality of hard drive rack unit can be installed inside the hard drive rack unit 30 therein. The present invention includes the following features:

A rotatable member 40 is disposed between the floppy disc rack unit 20 and the hard drive rack unit 30. With this rotatable device 40 installed, the hard drive rack 30 can be rotated by 90 degrees, thereby facilitating easy installation of the hard disk drive. Referring to FIG. 3, a clip member 401 formed on the rotatable device 40 is correspondingly inserted in an opening slot 201 formed on the floppy disc rack unit 20. A bolt 402 is formed on one corner of the rotatable device 40 whereby inserting to an aperture 301 formed on the hard drive rack unit 30. An adaptor member 403 is in reversed L-shape and disposed on a bottom side of the rotatable device 40 whereby inserting to an arched slot 302 formed on hard drive rack unit 30 to allow moving back and forth. A wedge member 4041 is formed on a semi-circular first block 404 of the rotatable device 40. A corresponding semi-circular second block 303 disposed on the hard drive rack unit 30 is provided with a hole 3031. A handle block 405 is formed on an edge of the rotatable device 40, next to the wedge member 4041. A bottom side of the handle block 405 is provided with a cogged surface, wherein a hook member 4051 is disposed on one end of the cogged surface thereby firmly fastening to the hard drive rack unit 30.

Figure 4:
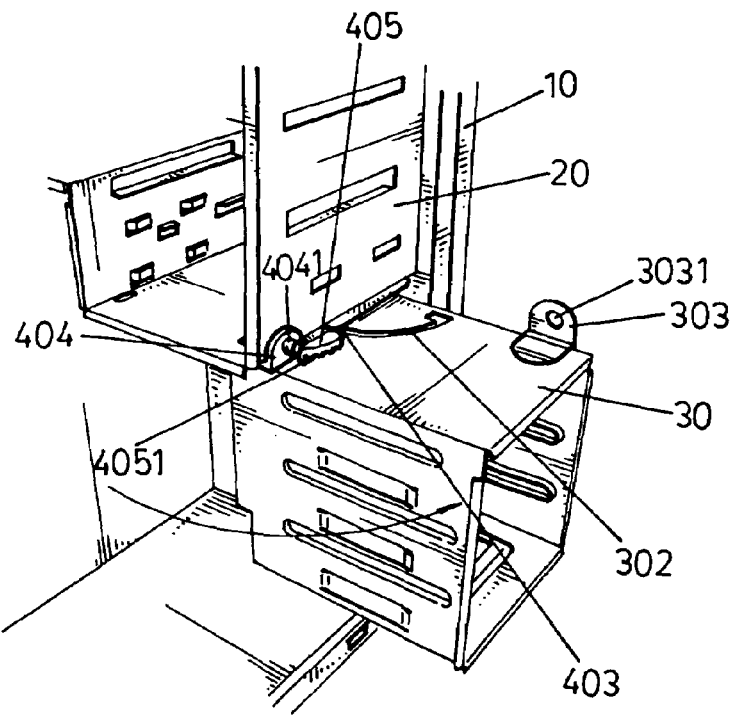
FIG. 4 shows the drive, rack unit being rotated by 90 degrees according to the present invention.

Referring to FIG. 1, the hard drive rack unit 30 is installed beneath the floppy disc rack unit 20. The hook member 4051 disposed on the handle block 405 of the rotatable device 40 is fastened to the hard drive rack unit 30 at an upper edge thereof. The wedge member 4041 is inserted to the hole 3031 of the hard drive rack unit 30. Referring to FIG. 4, when lifting the handle block 405 of the rotatable device 40, the hook member 4051 is detached from the upper edge of the hard drive rack unit 30 thereby enabling rotation of the hard drive rack unit 30 by 90 degrees and releasing the hole 3031 of hard drive rack unit 30 from the from the wedge member 4041 of rotatable device 40. The hard drive rack unit 30, with a bolt 402 being used as a pivotal and guided through the arched sliding slot 302 thereby moving the adaptor member 403 of the rotatable device 40.

What is claimed is:

1. A rotatable device for easy installation and replacement of a hard drive having a hard drive rack unit installed underneath a floppy disc rack unit in a computer casing comprising:

a clip member being inserted to a slot opening form on the floppy disc rack unit; a bolt I is formed on one corner of the rotatable device whereby inserting to an aperture formed on the hard drive rack unit; an adaptor bolt in reverse L-shape is inserted to an arched sliding slot formed on the hard drive rack unit; the rotatable device having a semi-circled first block and the hard drive rack unit having a semi-circled second block; a wedge member is formed on a semi-circled first block thereby correspondingly inserting to a hole form on a semi-circled second block; the rotatable device having a handle block formed on an edge thereof and is disposed next to the wedge member, wherein, a hook member is formed on a bottom side of the handle block thereby fastening to an upper edge of the hard drive rack unit in position; when lifting the handle, the hard drive rack unit being rotated by 90 degrees, allowing easy installation of the hard drive.

* * * * *